(12) United States Patent
Wang

(10) Patent No.: US 11,532,685 B2
(45) Date of Patent: Dec. 20, 2022

(54) DOUBLED-SIDE DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Deqi Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 134 days.

(21) Appl. No.: 16/770,016

(22) PCT Filed: Apr. 10, 2020

(86) PCT No.: PCT/CN2020/084287
§ 371 (c)(1),
(2) Date: Jun. 4, 2020

(87) PCT Pub. No.: WO2021/189557
PCT Pub. Date: Sep. 30, 2021

(65) Prior Publication Data
US 2021/0305342 A1 Sep. 30, 2021

(30) Foreign Application Priority Data
Mar. 26, 2020 (CN) .......................... 202010223009.4

(51) Int. Cl.
*H01L 27/32* (2006.01)
*H01L 51/56* (2006.01)
*G02F 1/1368* (2006.01)

(52) U.S. Cl.
CPC ........ *H01L 27/3267* (2013.01); *G02F 1/1368* (2013.01); *H01L 27/322* (2013.01);
(Continued)

(58) Field of Classification Search
CPC .............. H01L 27/3267; H01L 27/322; H01L 27/3262; H01L 51/56; G02F 1/1368
(Continued)

(56) References Cited

U.S. PATENT DOCUMENTS

2003/0112217 A1* 6/2003 Lee .......................... H04M 1/22
345/102
2006/0227981 A1* 10/2006 Miyata ................... G06F 1/1688
349/1
(Continued)

FOREIGN PATENT DOCUMENTS

CN 2842478 Y 11/2006
CN 1967343 A 5/2007
(Continued)

OTHER PUBLICATIONS

English Machine Translation of CN110320703 (Year: 2019).*
English Machine Translation of CN2842478Y (Year: 2006).*

*Primary Examiner* — Dzung Tran
(74) *Attorney, Agent, or Firm* — PV IP PC; Wei Te Chung; Ude Lu

(57) ABSTRACT

The present invention provides a double-sided display device and a manufacturing method thereof. The double-sided display includes an array substrate, an organic light-emitting functional layer, and a semi-transparent semi-reflective electrode arranged in sequence, and a liquid crystal cell disposed on a side of the semi-transparent semi-reflective electrode close to the organic light-emitting functional layer. One part of light emitted by the organic light-emitting functional layer penetrates through the semi-transparent semi-reflective electrode to display on one side of the double-sided display device, and the other part of the light is reflected toward the liquid crystal unit by the semi-
(Continued)

transparent semi-reflective electrode to display on the other side of the double-sided display.

12 Claims, 3 Drawing Sheets

(52) U.S. Cl.
CPC .......... *H01L 27/3262* (2013.01); *H01L 51/56* (2013.01); *H01L 2251/308* (2013.01)

(58) Field of Classification Search
USPC .......................................................... 257/40
See application file for complete search history.

(56) References Cited

U.S. PATENT DOCUMENTS

| | | | |
|---|---|---|---|
| 2007/0109465 A1 | 5/2007 | Jung et al. | |
| 2008/0304248 A1* | 12/2008 | Jin ...................... | H01L 27/3267 349/1 |
| 2014/0252336 A1 | 9/2014 | Kobayashi | |
| 2016/0246116 A1* | 8/2016 | Yang ................. | G02F 1/133308 |
| 2019/0004566 A1* | 1/2019 | Lee ....................... | G06F 1/1688 |

FOREIGN PATENT DOCUMENTS

| | | |
|---|---|---|
| CN | 106707583 A | 5/2017 |
| CN | 106873218 A | 6/2017 |
| CN | 206450937 U | 8/2017 |
| CN | 110320703 A | 10/2019 |
| KR | 20080000762 A | 1/2008 |
| KR | 20190057172 A | 5/2019 |

* cited by examiner

DOUBLED-SIDE DISPLAY DEVICE AND MANUFACTURING METHOD THEREOF

FIELD OF INVENTION

The present disclosure relates to the field of display technology, and more particularly, to a doubled-side display device and a manufacturing method thereof.

BACKGROUND OF INVENTION

Organic light-emitting diode (OLED) displays have become mainstream display products on market due to their advantages such as flexibility, flexibility, self-luminescence, and wide viewing angle, and are known as the most promising display technology after liquid crystal displays (LCDs). OLED light-emitting devices adopt sandwich structure. When current is applied to both ends, electrons and holes are injected into an organic light-emitting layer, and different organic light-emitting materials emit different colors of light under an excitation of excitons, thereby being applied to various display products.

At present, OLED screens are gradually applied in high-end models in a field of mobile phones, and various screens have been gradually developed, such as full screen, water drop screen, surround screen. However, current studies about double-sided screens is few. A manufacturing method adopts directly laminating two display panels in the most of current double-sided screen patents. The double-sided screens of adoption of such method have a greater thickness and poor touch sense, which seriously affects user experience.

SUMMARY OF INVENTION

The present disclosure provides a doubled-side display device and a manufacturing method thereof, which not only realizes double-sided display, but also greatly reduce a screen thickness and improve touch sense.

In a first aspect, the present disclosure provides a double-sided display device. The double-sided display device comprises an array substrate, an organic light-emitting functional layer and a semi-transparent semi-reflective electrode arranged on the array substrate in sequence, and a liquid crystal unit disposed on a side of the semi-transparent semi-reflective electrode close to the organic light-emitting functional layer.

One part of light emitted by the organic light-emitting functional layer penetrates through the semi-transparent semi-reflective electrode to display on one side of the double-sided display device, and the other part of the light is reflected toward the liquid crystal unit by the semi-transparent semi-reflective electrode to display on the other side of the double-sided display.

In the double-sided display device provided by the present disclosure, the organic light-emitting functional layer comprises a plurality of organic light-emitting units arranged at intervals, and the liquid crystal unit is filled between the plurality of organic light-emitting units.

In the double-sided display device provided by the present disclosure, the double-sided display device further comprises a plurality of spacing units disposed in one-to-one correspondence with the plurality of organic light-emitting units, and each of the spacing units is disposed around the corresponding organic light-emitting unit and configured to isolate the organic light-emitting unit and the liquid crystal unit.

In the double-sided display device provided by the present disclosure, the double-sided display device further comprises a color film substrate on a side of the array substrate away from the liquid crystal unit.

In the double-sided display device provided by the present disclosure, each of the organic light-emitting units comprises one of a red light-emitting unit, a green light-emitting unit, or a blue light-emitting unit.

In the double-sided display device provided by the present disclosure, the array substrate comprises a first thin film transistor array and a second thin film transistor array. The first thin film transistor array is electrically connected to the plurality of organic light-emitting units, and the second thin film transistor array is disposed corresponding to the liquid crystal unit.

In the double-sided display device provided by the present disclosure, the array substrate further comprises first transparent electrodes disposed corresponding to the plurality of organic light-emitting units and second transparent electrodes disposed corresponding to the liquid crystal unit.

The first thin film transistor array is electrically connected to the organic light-emitting unit through the first transparent electrode, and the second thin film transistor array is electrically connected to the second transparent electrode.

The first transparent electrode and the semi-transparent semi-reflective electrode are combined to control the plurality of organic light-emitting units to emit light, and the second transparent electrode and the semi-transparent semi-reflective electrode are combined to control a deflection of liquid crystal molecules in the liquid crystal unit.

In the double-sided display device provided by the present disclosure, the first transparent electrode and the second transparent electrode are made of indium tin oxide.

In the double-sided display device provided by the present disclosure, the double-sided display device further comprises a conductive layer disposed between the organic light-emitting functional layer and the semi-transparent semi-reflective electrode, and the conductive layer is made of an organic material with a high refractive index.

In the double-sided display device provided by the present disclosure, the double-sided display device further comprises a color film substrate on a side of the array substrate away from the organic light-emitting functional layer, and the liquid crystal unit is located between the array substrate and the color film substrate.

In a second aspect, the present disclosure further provides a double-sided display device. The double-sided display device comprises an array substrate, and an organic light-emitting functional layer, a conductive layer, and a semi-transparent semi-reflective electrode arranged on the array substrate in sequence, wherein the conductive layer is made of an organic material with a high refractive index.

The organic light-emitting functional layer comprises a plurality of organic light-emitting units arranged at intervals, and the double-sided display device further comprises a liquid crystal unit is filled between the plurality of organic light-emitting units.

One part of light emitted by the organic light-emitting functional layer penetrates through the semi-transparent semi-reflective electrode to display on one side of the double-sided display device, and the other part of the light is reflected toward the liquid crystal unit by the semi-transparent semi-reflective electrode to display on the other side of the double-sided display.

In the double-sided display device provided by the present disclosure, the double-sided display device further comprises a plurality of spacing units disposed in one-to-one correspondence with the plurality of organic light-emitting units, and each of the spacing units is disposed around the corresponding organic light-emitting unit and configured to isolate the organic light-emitting unit and the liquid crystal unit In a third aspect, the present disclosure further provides a manufacturing method of a double-sided display device comprising steps as follows: providing an array substrate; forming an organic light-emitting functional layer and a semi-transparent semi-reflective electrode on the array substrate in sequence; forming a liquid crystal unit on a side of the semi-transparent semi-reflective electrode close to the organic light-emitting functional layer. Wherein, one part of light emitted by the organic light-emitting functional layer penetrates through the semi-transparent semi-reflective electrode to display on one side of the double-sided display device, and the other part of the light is reflected toward the liquid crystal unit by the semi-transparent semi-reflective electrode to display on the other side of the double-sided display.

In the manufacturing method of the double-sided display device provided by the present disclosure, the organic light-emitting functional layer comprises a plurality of organic light-emitting units arranged at intervals. Forming the plurality of organic light-emitting units comprises steps as follows: forming a plurality of spacing units on the array substrate, wherein each of spacing units is a closed loop structure; and filling an organic light-emitting material in each of the spacing units to form the organic light-emitting unit.

In the manufacturing method of the double-sided display device provided by the present disclosure, a shape of the spacing unit is any one of circle, ellipse, or rectangle.

In the manufacturing method of the double-sided display device provided by the present disclosure, each of the organic light-emitting units comprises one of a red light-emitting unit, a green light-emitting unit, or a blue light-emitting unit.

In the manufacturing method of the double-sided display device provided by the present disclosure, forming the liquid crystal unit on the side of the semi-transparent semi-reflective electrode close to the organic light-emitting functional layer comprises steps as follow: filling liquid crystals between the plurality of spacing units to form the liquid crystal unit.

In the manufacturing method of the double-sided display device provided by the present disclosure, filling the liquid crystal between the plurality of spacing units uses a one drop filling technology.

In the manufacturing method of the double-sided display device provided by the present disclosure, the manufacturing method further comprises a step as follows: forming a conductive layer between the organic light-emitting functional layer and the semi-transparent semi-reflective electrode, wherein the conductive layer is made of an organic material with a high refractive index.

In the manufacturing method of the double-sided display device provided by the present disclosure, the manufacturing method further comprises steps as follows: forming a color film substrate is on a side of the array substrate away from the liquid crystal unit.

Compared with the prior art, in the doubled-sided display device provided by the present disclosure, organic electroluminescence display technology and liquid crystal display technology are integrated in the same display device, wherein one part of light emitted by the organic light-emitting functional layer penetrates through the semi-transparent semi-reflective electrode to display on one side of the double-sided display device, and the other part of the light is reflected toward the liquid crystal unit by the semi-transparent semi-reflective electrode to display on the other side of the double-sided display. Moreover, in the present disclosure, the organic light-emitting functional layer and the liquid crystal unit are arranged on a same layer, which greatly reduces a thickness of a screen and improves touch sense.

DESCRIPTION OF DRAWINGS

The following describes specific embodiment of the present disclosure in detail with reference to drawings, which will make the technical solutions and other beneficial effects of the present disclosure obvious.

DETAILED DESCRIPTION OF PREFERRED EMBODIMENTS

Figure 1:
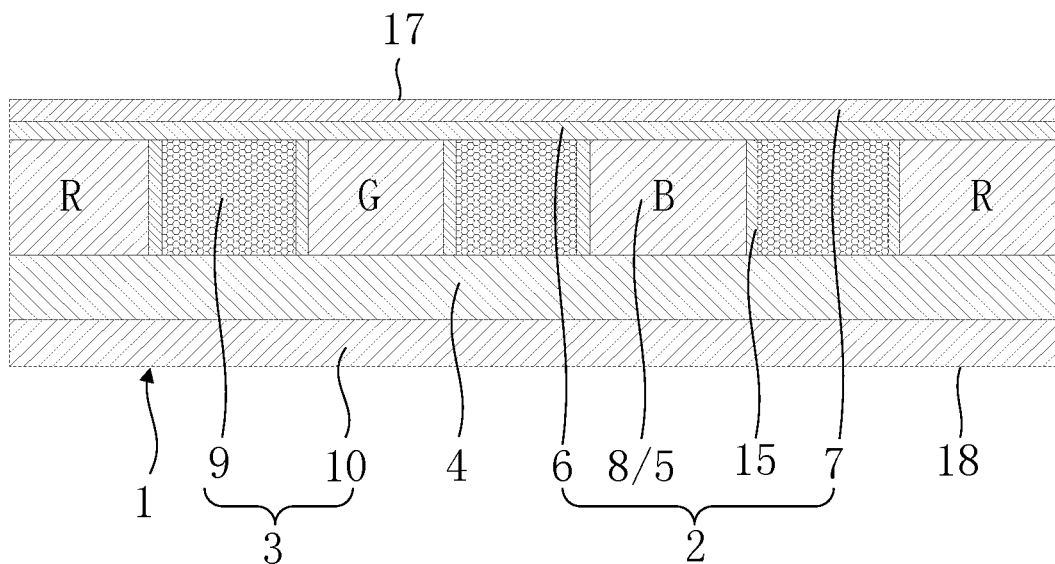
FIG. 1 is a schematic partially sectional view of a double-sided display provided by an embodiment of the present disclosure.

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

In descriptions of the present disclosure, it should be noted that, orientations or position relationships indicated by the terms, such as "center", "longitudinal", "transverse", "length", "width", "thickness", "upper", "lower", "front", "back", "left", "right", "vertical", "horizontal", "top", "bottom", "inside", "outside", "clockwise", "counterclockwise", etc. are based on the orientations or position relationships shown in the drawings. These are only convenience for describing the present disclosure and simplifying the descriptions, and does not indicate or imply that the device or element must have a specific orientation, a structure and an operation in the specific orientation, so it cannot be understood as a limitation on the present disclosure. In addition, the terms "first" and "second" are used for describing purposes only, and cannot be understood as indicating or implying relative importance or implicitly indicating the number of technical features indicated. Thus, the features defined as "first" and "second" may explicitly or implicitly include one or more of the features. In the descriptions of the present disclosure, the meaning of "plurality" is two or more, unless it is specifically defined otherwise.

In the present disclosure, the terms "mounting", "connected", "fixed" and the like should be broadly understood unless expressly stated or limited otherwise. For example, it may be fixed connected, removably connected, or integrated; it may be mechanically connected, or an electrically connected; it may be directly connected, or indirectly connected through an intermediary; it may be a connection between two elements or an interaction between two elements. For those skilled in the art, the specific meanings of the above terms in the present disclosure may be understood based on specific situations.

In the present disclosure, unless explicitly stated and defined otherwise, the first feature may be "above" or "below" the second feature and may include direct contact between the first and second features. It may also include that the first and second features are not in direct contact but are contacted by another feature between them. Moreover, the first feature is "above" the second feature, including the first feature directly above and obliquely above the second feature, or merely indicates that the first feature is higher in level than the second feature. The first feature is "below" the second feature, including the first feature is directly below and obliquely below the second feature, or only indicates that the first feature is less horizontal than the second feature.

The following disclosure provides many different embodiments or examples for realizing different structures of the present disclosure. To simplify the present disclosure, components and settings of specific examples are described below. They are only examples and are not intended to limit the present disclosure. In addition, the present disclosure may repeat reference numbers and/or reference letters in different examples, this repetition is for the purpose of simplicity and clarity, and does not itself indicate the relationship between various embodiments and/or settings discussed. In addition, the present disclosure provides examples of various specific processes and materials, but those of ordinary skill in the art may be aware of the present disclosure of other processes and/or the use of other materials.

Figure 2:
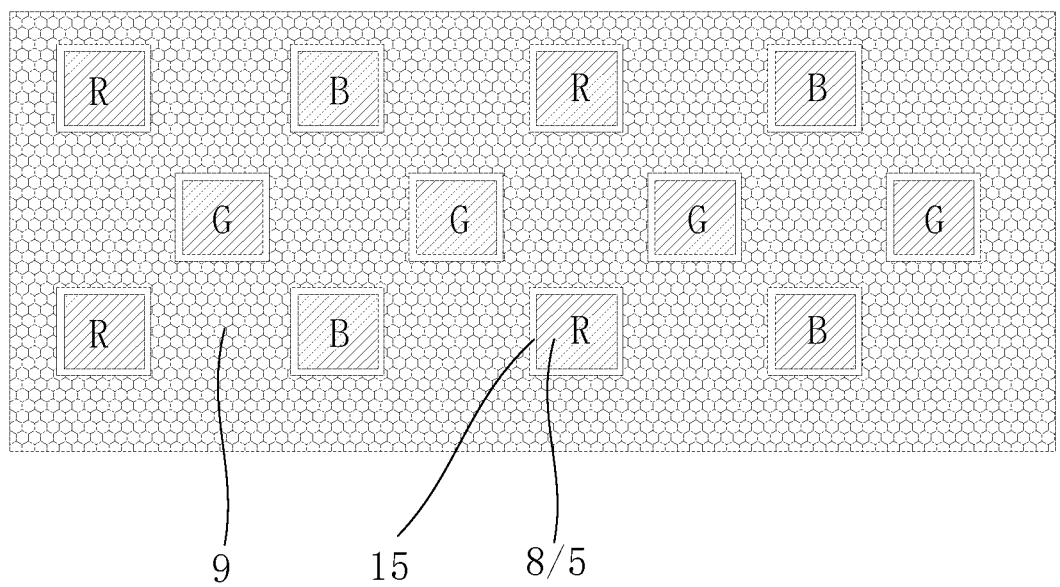
FIG. 2 is a top view of an organic light-emitting functional layer and a liquid crystal unit in the double-sided display provided by FIG. 1.

As shown in FIG. 1 and FIG. 2, an embodiment of the present disclosure provides a double-sided display device 1. The double-sided display device 1 comprises an array substrate 4, an organic light-emitting functional layer 5, a conductive layer 6, and a semi-transparent semi-reflective electrode 7 arranged on the array substrate 4 in sequence, a liquid crystal unit 9 arranged in a same layer as the organic light-emitting functional layer 5, a color film substrate 10 disposed on a side of the array substrate 4 away from the liquid crystal unit 9, wherein the organic light-emitting functional layer 5 comprises a plurality of organic light-emitting units 8 arranged at intervals, and the liquid crystal unit 9 is filled between the plurality of organic light-emitting units 8.

Specifically, the organic light-emitting functional layer 5, the conductive layer 6, and the semi-transparent semi-reflective electrode 7 form an organic electroluminescence display module 2, and the organic electroluminescence display module 2 and the array substrate 4 are combined to realize an organic electroluminescence display. The liquid crystal unit 9 and the color film substrate 10 form a liquid crystal display module 3, and the liquid crystal display module 3 and the array substrate 4 are combined to realize liquid crystal display.

Specifically, the semi-transparent semi-reflective electrode 7 is a cathode of the organic electroluminescence display module 2 and allows one part of light to penetrate through and reflects the other part of the light. After the organic light-emitting functional layer 5 is turned on by the array substrate 4, light emits in a direction of the semi-transparent semi-reflective electrode 7, and one part of the light can penetrate through the semi-transparent semi-reflective electrode 7 to display on a side of the double-sided display device 1 (such as a first side 17). Meanwhile, the other part of the light is reflected toward the liquid crystal unit 9 of the liquid crystal display module 3 by the semi-transparent semi-reflective electrode 7 to display on the other side of the double-sided display device 1 (such as a second side 18, and the first side 17 is opposite to the second side 18), thereby realizing double-sided display. Wherein, the first side 17 of the double-sided display device 1 is an organic electroluminescence display, and the second side 18 of the double-sided display device 1 is a liquid crystal display. Moreover, the liquid crystal display module 3 provides a light source without an additional backlight module, and the organic electroluminescence display module 2 provides a light source for the liquid crystal display module 3 through a reflection of the semi-transparent semi-reflective electrode 7 while emitting light, which is beneficial to reduce a thickness of a screen.

Specifically, each of the organic light-emitting units 8 comprises a hole injection layer, a hole transport layer, a light-emitting layer, an electron transport layer, and an electron injection layer that are sequentially arranged on the array substrate 4. Each of the organic light-emitting unit 8 comprises any one of a red light-emitting unit (R), a green light-emitting unit (G), and a blue light-emitting unit (B), wherein the red light-emitting unit, the green light-emitting unit, and the blue light-emitting unit respectively emit a red light, a green light, and a blue light.

Specifically, when the plurality of organic light-emitting units 8 emit the red light, the green light, and the blue light, the red light, green light and blue light reflected by the semi-transparent semi-reflective electrode 7 are mixed to form a white light, and the white light is configured to a light source of the liquid crystal display module 3. When the white light is reflected to the liquid crystal unit 9, the liquid crystal unit 9 converts the white light into a polarized light, and the polarized light is emitted through the array substrate 4 and the color film substrate 10 for displaying images. However, a polarizer corresponding to the liquid crystal unit 9 is disposed on a side of the color film substrate 10, and the polarizer may be disposed between the color film substrate 10 and the array substrate 4 or on a side of the color film substrate 10 away from the array substrate 4, which is not limited herein.

Specifically, the conductive layer 6 is made of an organic material with a high refractive index, the high-refractive-index conductive layer 6 can reduce waveguide loss in a cavity length of the organic light-emitting functional layer 5, and then transfer most of the light to the semi-transparent semi-reflective electrode 7, which is beneficial to improve light utilization rate.

Figure 3:
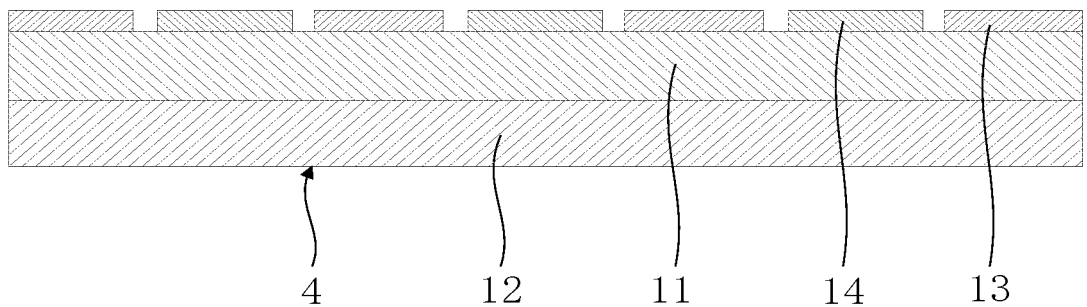
FIG. 3 is a schematic partially sectional view of an array substrate in the double-sided display provided by FIG. 1.

Specifically, as shown in FIG. 3, the array substrate 4 comprises a first thin film transistor array 11 and a second thin film transistor array 12, wherein the first thin film transistor array 11 is electrically connected to the plurality of organic light-emitting units 8 and configured to control an operation of the plurality of organic light-emitting units 8, and the second thin film transistor array 12 is disposed corresponding to the liquid crystal unit 9 and configured to control deflection of liquid crystal molecules in the liquid crystal unit 9. Moreover, the array substrate 4 comprises first transparent electrodes 13 and second transparent electrodes 14, and the first transparent electrodes 13 and the second transparent electrodes 14 are made of indium tin oxides (ITO), wherein the first transparent electrodes 13 are anodes of the organic electroluminescence display module 2. The first thin film transistor array 11 is electrically connected to the hole injection layer of the organic light-emitting unit 8 through the first transparent electrodes 13 and controls the organic light-emitting unit 8 to emit light by applying a voltage between the first transparent electrodes 13 and the semi-transparent semi-reflective electrode 7. The second transparent electrodes 14 and the semi-transparent semi-reflective electrode 7 are respectively located on both sides of the liquid crystal unit 9, the second thin film transistor array 12 is electrically connected to the second transparent electrodes 14, and a deflection angle of the liquid crystal molecules in the liquid crystal unit 9 is adjusted by changing a voltage between the second transparent electrodes 14 and the semi-transparent semi-reflective electrode 7 to control light transmittance.

That is, the organic electroluminescence display module 2 and the liquid crystal display module 3 share a same electrode (semi-transparent semi-reflective electrode 7), and the organic electroluminescence display module 2 and the liquid crystal display module 3 are controlled by the same array substrate 4, which respectively realizes organic electroluminescence display and liquid crystal display, adoption of structure design is beneficial to reducing the thickness of the screen.

In one embodiment, the double-sided display device 1 further comprises a plurality of spacing units 15 disposed in one-to-one correspondence with the plurality of organic light-emitting units 8. As shown in FIG. 1 and FIG. 2, the plurality of spacing units 15, the organic light-emitting functional layer 5, the conductive layer 6, and the semi-transparent semi-reflective electrode 7 form the organic electroluminescence display module 2. Each of the spacing units 15 is disposed around the corresponding organic light-emitting unit 8 and configured to isolate the organic light-emitting unit 8 and the liquid crystal unit 9, which can prevent the organic light-emitting unit 8 and the liquid crystal unit 9 from mixing or interfering with each other during preparation process or use process. Therefore, the spacing units 15 are not only beneficial to improve product yield, but also to improve production efficiency and device stability of the organic light-emitting unit 8 and liquid crystal unit 9. Specifically, a shape of the spacing unit 15 comprises a circle, an ellipse, or a rectangle, which is not limited herein.

In the present embodiment, organic electroluminescence display technology and liquid crystal display technology are integrated in the same display device, one part of light emitted by the organic light-emitting functional layer 5 of the organic electroluminescence display module 2 penetrates through the semi-transparent semi-reflective electrode 7 to display on the first side 17 of the double-sided display device 1, and the other part of the light is reflected toward the liquid crystal unit 9 by the semi-transparent semi-reflective electrode 7 to provide a light source for the liquid crystal display module 3 to display on the second side 18 of the double-sided display device 1, thereby realizing double-sided display. In addition, the present disclosure does not need to add a backlight module for liquid crystal display, and uses the array substrate 4 to simultaneously control the operation of the organic electroluminescence display module 2 and the liquid crystal display module 3. The organic electroluminescence display module 2 and the liquid crystal display module 3 share the same electrode, and more importantly, the organic light-emitting functional layer 5 of the organic electroluminescence display module 2 and the liquid crystal unit 9 of the liquid crystal display module 3 are arranged on the same layer, which greatly reduces a thickness of the double-sided display device 1 and improves touch sense, thereby improving user experience.

Figure 4:
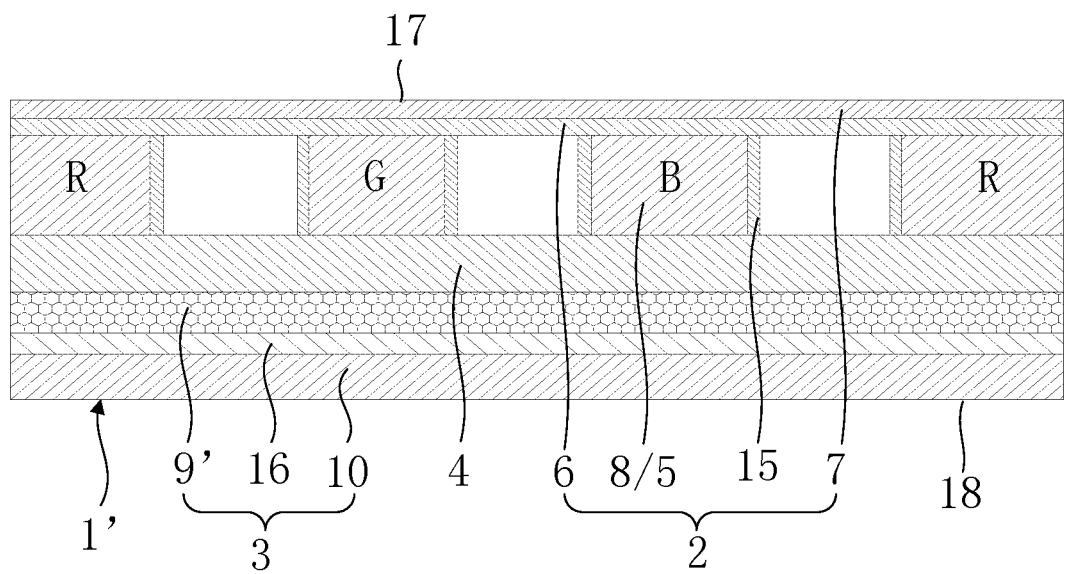
FIG. 4 is the other schematic partially sectional view of the double-sided display provided by the embodiment of the present disclosure.

As shown in FIG. 4, the embodiment of the present disclosure further provides a double-sided display device 1', which is different from the above embodiment in that the liquid crystal unit 9' of the liquid crystal display module 3 is disposed between the array substrate 4 and the color film substrate 10, and a third transparent electrode 16 is disposed on a side of the color film substrate 10 close to the liquid crystal unit 9'.

Specifically, the second transparent electrodes 14 and the third transparent electrode 16 in the array substrate 4 are located on both sides of the liquid crystal unit 9', the second thin film transistor array 12 is electrically connected to the second transparent electrodes 14, and a deflection angle of the liquid crystal molecules in the liquid crystal unit 9' is adjusted by changing a voltage between the second transparent electrodes 14 and the third transparent electrode 16 to control light transmittance.

Specifically, a material of the third transparent electrode 16 may be the same as a material of the second transparent electrode 14, and the second transparent electrode 14 may be disposed close to the liquid crystal unit 9.

In the present embodiment, organic electroluminescence display technology and liquid crystal display technology are integrated in the same display device, one part of light emitted by the organic light-emitting functional layer 5 of the organic electroluminescence display module 2 penetrates through the semi-transparent semi-reflective electrode 7 to display on the first side 17 of the double-sided display device 1, and the other part of the light is reflected toward the liquid crystal unit 9 by the semi-transparent semi-reflective electrode 7 to provide a light source for the liquid crystal display module 3 to display on the second side 18 of the double-sided display device 1, thereby realizing double-sided display. In addition, the present disclosure does not need to add a backlight module for liquid crystal display, and uses the array substrate 4 to simultaneously control the operation of the organic electroluminescence display module 2 and the liquid crystal display module 3, which reduces a thickness of the double-sided display device 1' and improves touch sense, thereby improving user experience.

In one embodiment, the liquid crystal unit may also be disposed between the organic light-emitting functional layer and the semi-transparent semi-reflective electrode. Moreover, the liquid crystal unit may also be disposed between the organic light-emitting functional layer and the array substrate.

It should be noted that the color film substrates in all the embodiments provided by the present disclosure can also be replaced with glass substrates without color filters, in which case the liquid crystal display module is a black and white display. When the liquid crystal unit is disposed on a side of the array substrate close to the organic light-emitting functional layer, the color film substrate may not be disposed on a side of the array substrate away from the organic light-emitting functional layer, and only a polarizer is disposed on the side of the array substrate away from the organic light-emitting functional layer, in which case the liquid crystal display module is a black and white display and the thickness of the screen is further reduced.

Figure 5:
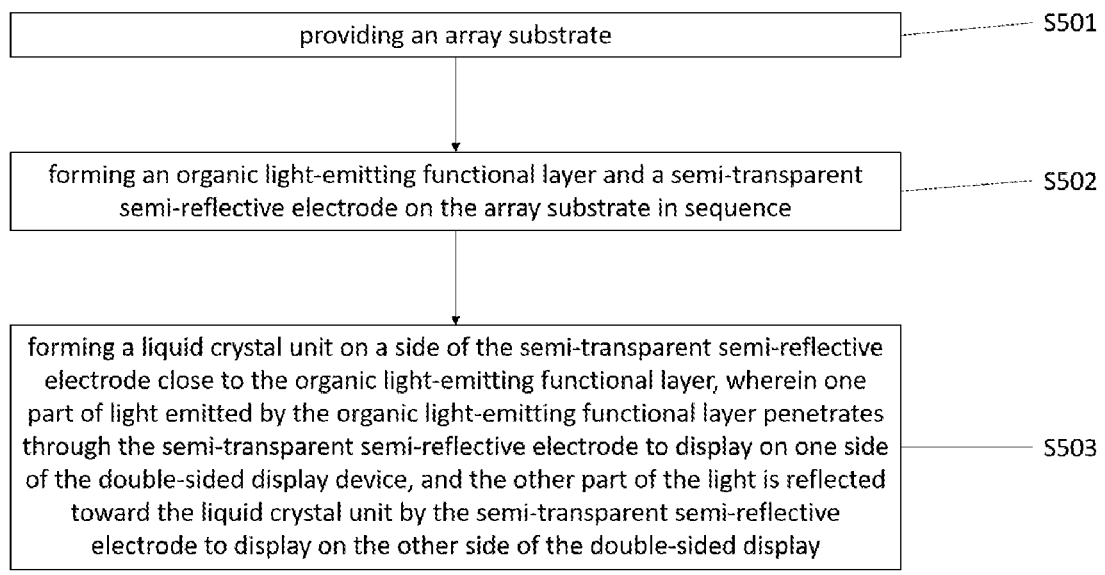
FIG. 5 is a flowchart of a manufacturing method of the double-sided display provided by the embodiment of the present disclosure.

As shown in FIG. 5, the embodiment of the present disclosure provides a manufacturing method of the double-sided display device 1 comprising steps as follows:

Step S501: providing an array substrate.

Step S502: forming an organic light-emitting functional layer and a semi-transparent semi-reflective electrode on the array substrate in sequence.

Specifically, as shown in FIG. 2, the organic light-emitting functional layer 5 comprises a plurality of organic light-emitting units 8 arranged at intervals. Forming the plurality of organic light-emitting units comprises steps as follows: forming a plurality of spacing units on the array substrate, wherein each of spacing units is a closed loop structure, and filling an organic light-emitting material in each of the spacing units to form the organic light-emitting unit.

Specifically, each of the organic light-emitting units comprises a hole injection layer, a hole transport layer, a light-emitting layer, an electron transport layer, and an electron injection layer that are sequentially arranged on the array substrate. Each of the organic light-emitting unit comprises any one of a red light-emitting unit, a green light-emitting unit, and a blue light-emitting unit, wherein the red light-emitting unit, the green light-emitting unit, and the blue light-emitting unit respectively emit a red light, a green light, and a blue light.

Specifically, forming the plurality of spacing units comprises steps as follows: coating a layer of organic photoresist on the array substrate; covering a patterned mask on organic photoresist; and exposing and developing the organic photoresist covered with the mask to form a patterned organic photoresist, that is, to form the plurality of spaced units.

Specifically, a shape of the spacing unit comprises a circle, an ellipse, or a rectangle, which is not limited herein. The spacing units prevent the organic light-emitting unit and the liquid crystal unit from mixing or interfering with each other during preparation process or use process. Therefore, the spacing units are not only beneficial to improve product yield, but also to improve production efficiency of the organic light-emitting unit and liquid crystal unit.

Step S503: forming a liquid crystal unit on a side of the semi-transparent semi-reflective electrode close to the organic light-emitting functional layer. Wherein, one part of light emitted by the organic light-emitting functional layer penetrates through the semi-transparent semi-reflective electrode to display on one side of the double-sided display device, and the other part of the light is reflected toward the liquid crystal unit by the semi-transparent semi-reflective electrode to display on the other side of the double-sided display.

Specifically, the semi-transparent semi-reflective electrode allows one part of light to penetrate through and reflects the other part of the light.

Specifically, the step S503 comprises as follows: filling liquid crystals between the plurality of spacing units to form the liquid crystal unit.

Specifically, filling the liquid crystal between the plurality of spacing units form the liquid crystal unit, and it can use one drop filling (ODF) technology to fill liquid crystals. It should be noted that after the plurality of spacing units are formed on the array substrate, the organic light-emitting functional layer may be formed first, and then the liquid crystal unit may be formed. Moreover, the liquid crystal unit may be formed first, and then the organic light-emitting functional layer may be formed. Forming the organic light-emitting functional layer first is described as an example in the present embodiment, but an order of forming the organic light-emitting functional layer and the liquid crystal unit is not limited.

In one embodiment, before the semi-transparent semi-reflective electrode is formed on a side of the organic light-emitting functional layer away from the array substrate, a conductive layer may be formed first, and then the semi-transparent semi-reflective electrode is formed on a side of the conductive layer away from the organic light-emitting functional layer, wherein the conductive layer is made of an organic material with a high refractive index. The high-refractive-index conductive layer can reduce waveguide loss in a cavity length of the organic light-emitting functional layer 5, and then transfer most of the light to the semi-transparent semi-reflective electrode, which is beneficial to improve light utilization rate.

In one embodiment, the manufacturing method comprises steps as follows: forming a color film substrate is on a side of the array substrate away from the liquid crystal unit.

The double-sided display produced in the present embodiment is shown in FIG. 1, The double-sided display device 1 comprises an array substrate 4, an organic light-emitting functional layer 5, a conductive layer 6, and a semi-transparent semi-reflective electrode 7 arranged on the array substrate 4 in sequence, a liquid crystal unit 9 arranged in a same layer as the organic light-emitting functional layer 5, a color film substrate 10 disposed on a side of the array substrate 4 away from the liquid crystal unit 9, wherein the organic light-emitting functional layer 5 comprises a plurality of organic light-emitting units 8 arranged at intervals, and the liquid crystal unit 9 is filled between the plurality of organic light-emitting units 8.

Specifically, the organic light-emitting functional layer 5, the conductive layer 6, and the semi-transparent semi-reflective electrode 7 form an organic electroluminescence display module 2, and the organic electroluminescence display module 2 and the array substrate 4 are combined to realize an organic electroluminescence display. The liquid crystal unit 9 and the color film substrate 10 form a liquid crystal display module 3, and the liquid crystal display module 3 and the array substrate 4 are combined to realize liquid crystal display.

Specifically, after the organic light-emitting functional layer 5 is turned on by the array substrate 4, light emits in a direction of the semi-transparent semi-reflective electrode 7, and one part of the light can penetrate through the semi-transparent semi-reflective electrode 7 to display on a side of the double-sided display device 1 (such as a first side 17). Meanwhile, the other part of the light is reflected toward the liquid crystal unit 9 of the liquid crystal display module 3 by the semi-transparent semi-reflective electrode 7 to display on the other side of the double-sided display device 1 (such as a second side 18, and the first side 17 is opposite to the second side 18), thereby realizing double-sided display. Wherein, the first side 17 of the double-sided display device 1 is an organic electroluminescence display, and the second side 18 of the double-sided display device 1 is a liquid crystal display. Moreover, the liquid crystal display module 3 provides a light source without an additional backlight module, and the organic electroluminescence display module 2 provides a light source for the liquid crystal display module 3 through a reflection of the semi-transparent semi-reflective electrode 7 while emitting light, which is beneficial to reduce a thickness of a screen.

Specifically, when the plurality of organic light-emitting units 8 emit a red light, a green light, and a blue light, the red light, green light and blue light reflected by the semi-transparent semi-reflective electrode 7 are mixed to form a white light, and the white light is configured to a light source of the liquid crystal display module 3. When the white light is reflected to the liquid crystal unit 9, the liquid crystal unit 9 converts the white light into a polarized light, and the polarized light is emitted through the array substrate 4 and the color film substrate 10 for displaying images. However, a polarizer corresponding to the liquid crystal unit 9 is disposed on a side of the color film substrate 10, and the polarizer may be disposed between the color film substrate 10 and the array substrate 4 or on a side of the color film substrate 10 away from the array substrate 4, which is not limited herein.

In one embodiment, as shown in FIG. 3, the array substrate 4 comprises a first thin film transistor array 11 and a second thin film transistor array 12, wherein the first thin film transistor array 11 is electrically connected to the plurality of organic light-emitting units 8 and configured to control an operation of the plurality of organic light-emitting units 8, and the second thin film transistor array 12 is disposed corresponding to the liquid crystal unit 9 and configured to control deflection of liquid crystal molecules in the liquid crystal unit 9. Moreover, the array substrate 4 comprises first transparent electrodes 13 and second transparent electrodes 14, and the first transparent electrodes 13 and the second transparent electrodes 14 are made of indium tin oxides, wherein the first transparent electrodes 13 are anodes of the organic electroluminescence display module 2. The first thin film transistor array 11 is electrically connected to the hole injection layer of the organic light-emitting unit 8 through the first transparent electrodes 13 and controls the organic light-emitting unit 8 to emit light by applying a voltage between the first transparent electrodes 13 and the semi-transparent semi-reflective electrode 7. The second transparent electrodes 14 and the semi-transparent semi-reflective electrode 7 are respectively located on both sides of the liquid crystal unit 9, the second thin film transistor array 12 is electrically connected to the second transparent electrodes 14, and a deflection angle of the liquid crystal molecules in the liquid crystal unit 9 is adjusted by changing a voltage between the second transparent electrodes 14 and the semi-transparent semi-reflective electrode 7 to control light transmittance.

That is, the organic electroluminescence display module 2 and the liquid crystal display module 3 share a same electrode (semi-transparent semi-reflective electrode 7), and the organic electroluminescence display module 2 and the liquid crystal display module 3 are controlled by the same array substrate 4, which respectively realizes organic electroluminescence display and liquid crystal display, adoption of structure design is beneficial to reducing the thickness of the screen.

In the present embodiment, organic electroluminescence display technology and liquid crystal display technology are integrated in the same display device, one part of light emitted by the organic light-emitting functional layer 5 of the organic electroluminescence display module 2 penetrates through the semi-transparent semi-reflective electrode 7 to display on the first side 17 of the double-sided display device 1, and the other part of the light is reflected toward the liquid crystal unit 9 by the semi-transparent semi-reflective electrode 7 to provide a light source for the liquid crystal display module 3 to display on the second side 18 of the double-sided display device 1, thereby realizing double-sided display. In addition, the present disclosure does not need to add a backlight module for liquid crystal display, and uses the array substrate 4 to simultaneously control the operation of the organic electroluminescence display module 2 and the liquid crystal display module 3. The organic electroluminescence display module 2 and the liquid crystal display module 3 share the same electrode, and more importantly, the organic light-emitting functional layer 5 of the organic electroluminescence display module 2 and the liquid crystal unit 9 of the liquid crystal display module 3 are arranged on the same layer, which greatly reduces a thickness of the double-sided display device 1 and improves touch sense, thereby improving user experience.

In the above embodiments, the description of each embodiment has its own emphasis. For a part that is not detailed in an embodiment, you can refer to the related descriptions of other embodiments.

The double-sided display device and the manufacturing method thereof provided by the embodiments of the present disclosure have been described in detail above. The present disclosure uses specific examples to describe principles and embodiments of the present disclosure. The descriptions of the above embodiments are only used to help understand technical solutions of the present disclosure and core ideas thereof. Moreover, those of ordinary skill in the art should understand that the technical solutions described in the aforesaid embodiments can still be modified, or have some technical features equivalently replaced. However, these modifications or replacements do not depart from a scope of the technical solutions of the embodiments of the present disclosure.

What is claimed is:

1. A double-sided display device, comprising:
   an array substrate;
   an organic light-emitting functional layer and a semi-transparent semi-reflective electrode arranged on the array substrate in sequence; and
   a liquid crystal unit disposed on a side of the semi-transparent semi-reflective electrode close to the organic light-emitting functional layer;
   wherein one part of light emitted by the organic light-emitting functional layer penetrates through the semi-transparent semi-reflective electrode to display on one side of the double-sided display device, and another part of the light is reflected toward the liquid crystal unit by the semi-transparent semi-reflective electrode to display on another side of the double-sided display,
   wherein the organic light-emitting functional layer and the liquid crystal unit share the semi-transparent semi-reflective electrode and are applied with a voltage through the semi-transparent semi-reflective electrode.

2. The double-sided display device as claimed in claim 1, wherein the organic light-emitting functional layer comprises a plurality of organic light-emitting units arranged at intervals, and the liquid crystal unit is filled between the plurality of organic light-emitting units.

3. The double-sided display device as claimed in claim 2, wherein the double-sided display device comprises a plurality of spacing units disposed in one-to-one correspondence with the plurality of organic light-emitting units, and each of the spacing units is a closed loop structure, disposed around the corresponding organic light-emitting unit, and configured to isolate the organic light-emitting unit and the liquid crystal unit.

4. The double-sided display device as claimed in claim 2, wherein the double-sided display device comprises a color film substrate on a side of the array substrate away from the liquid crystal unit.

5. The double-sided display device as claimed in claim 2, wherein each of the organic light-emitting units comprises one of a red light-emitting unit, a green light-emitting unit, or a blue light-emitting unit.

6. The double-sided display device as claimed in claim 2, wherein the array substrate comprises a first thin film transistor array and a second thin film transistor array;
   the first thin film transistor array is electrically connected to the plurality of organic light-emitting units; and
   the second thin film transistor array is disposed corresponding to the liquid crystal unit.

7. The double-sided display device as claimed in claim 6, wherein the array substrate comprises first transparent electrodes disposed corresponding to the plurality of organic light-emitting units and second transparent electrodes disposed corresponding to the liquid crystal unit;

the first thin film transistor array is electrically connected to the organic light-emitting unit through the first transparent electrode, and the second thin film transistor array is electrically connected to the second transparent electrode; and the first transparent electrode and the semi-transparent semi-reflective electrode are combined to control the plurality of organic light-emitting units to emit light, and the second transparent electrode and the semi-transparent semi-reflective electrode are combined to control a deflection of liquid crystal molecules in the liquid crystal unit.

8. The double-sided display device as claimed in claim 7, wherein the first transparent electrode and the second transparent electrode are made of indium tin oxide.

9. The double-sided display device as claimed in claim 1, wherein the double-sided display device comprises a conductive layer disposed between the organic light-emitting functional layer and the semi-transparent semi-reflective electrode, and the conductive layer is made of an organic material with a high refractive index.

10. The double-sided display device as claimed in claim 1, wherein the double-sided display device comprises a color film substrate on a side of the array substrate away from the organic light-emitting functional layer, and the liquid crystal unit is located between the array substrate and the color film substrate.

11. A double-sided display device, comprising:
an array substrate; and
an organic light-emitting functional layer, a conductive layer, and a semi-transparent semi-reflective electrode arranged on the array substrate in sequence;

wherein the conductive layer is made of an organic material with a high refractive index;

the organic light-emitting functional layer comprises a plurality of organic light-emitting units arranged at intervals;

the double-sided display device further comprises a liquid crystal unit is filled between the plurality of organic light-emitting units; and one part of light emitted by the organic light-emitting functional layer penetrates through the semi-transparent semi-reflective electrode to display on one side of the double-sided display device, and another part of the light is reflected toward the liquid crystal unit by the semi-transparent semi-reflective electrode to display on another side of the double-sided display, wherein the organic light-emitting functional layer and the liquid crystal unit share the semi-transparent semi-reflective electrode and are applied with a voltage through the semi-transparent semi-reflective electrode.

12. The double-sided display device as claimed in claim 11, wherein the double-sided display device comprises a plurality of spacing units disposed in one-to-one correspondence with the plurality of organic light-emitting units, and each of the spacing units is a closed loop structure, disposed around the corresponding organic light-emitting unit, and configured to isolate the organic light-emitting unit and the liquid crystal unit.

* * * * *